(12) United States Patent
Lee

(10) Patent No.: US 7,986,574 B2
(45) Date of Patent: Jul. 26, 2011

(54) DATA INPUT CIRCUIT TECHNICAL FIELD

(75) Inventor: Kyong Ha Lee, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 102 days.

(21) Appl. No.: 12/459,084

(22) Filed: Jun. 26, 2009

(65) Prior Publication Data

US 2010/0202225 A1     Aug. 12, 2010

(30) Foreign Application Priority Data

Feb. 12, 2009   (KR) .......................... 10-2009-0011597

(51) Int. Cl.
    *G11C 7/00*     (2006.01)
(52) U.S. Cl. ................... 365/194; 365/189.05
(58) Field of Classification Search .................. 365/194, 365/189.05
    See application file for complete search history.

(56) References Cited

U.S. PATENT DOCUMENTS

| 4,999,807 | A |   | 3/1991 | Akashi |
| 5,404,338 | A | * | 4/1995 | Murai et al. ............. 365/189.05 |
| 7,061,941 | B1 |  | 6/2006 | Zheng |

FOREIGN PATENT DOCUMENTS

| KR | 10-2006-0059299 | 6/2006 |
| KR | 10-2007-0080455 | 8/2007 |

* cited by examiner

*Primary Examiner* — Michael T Tran
(74) *Attorney, Agent, or Firm* — John P. White; Cooper & Dunham LLP

(57) ABSTRACT

A data input circuit comprises a sensing control unit which delays an internal write command by a predetermined period and generates a sense amplifier enable signal in response to a first clock signal, and a data sensing unit which senses align data and transfers the sensed data to a global line in response to the sense amplifier enable signal, wherein the sense amplifier enable signal is enabled at a time point when the align data is inputted in the data sensing unit.

23 Claims, 7 Drawing Sheets

DATA INPUT CIRCUIT TECHNICAL FIELD

TECHNICAL FIELD

This disclosure relates to a data input circuit of a semiconductor memory device, and more particularly, to a data input circuit capable of ensuring an internal Write To Read command Delay (tWTR) by increasing a write operation speed.

BACKGROUND

In recent times, with development and advancement of semiconductor manufacturing technologies, semiconductor devices continuously advance toward high integration and high speed and can be used in a variety of products from large home appliances to small mobile products.

To increase data processing speed of such semiconductor memory devices, a Single Data Rate (SDR) memory device, a Double Data Rate (DDR) memory device, a DDR2 memory device and the like have been developed and a cycle of a clock signal has become shorter and shorter. Also, control methods for increasing an operation speed of internal circuits have continuously been studied.

FIG. 1 is a block diagram illustrating a configuration of a data input circuit of a conventional semiconductor memory device.

The data input circuit illustrated in FIG. 1 includes a sense amplifier enable signal generating unit 500 and a data sensing unit 600.

The sense amplifier enable signal generating unit 500 receives a clock signal CLK and first through fourth command signals CMD<1:4>, and generates a sense amplifier enable signal SAEN. More specifically, the sense amplifier enable signal generating unit 500 receives the first through fourth command signals CMD<1:4>, generates a write command, delays the write command by a write latency (WL) and 3 cycles of the clock signal CLK, and generates the sense amplifier enable signal SAEN. The write latency means a delay time until external data is actually inputted to a data pad after input of the write command.

Meanwhile, the data sensing unit 600 multiplexes first through fourth align data ADIN<1:4> based on first through fourth sense amplifier selection signals SASEL<1:4>, senses the multiplexed data in response to the sense amplifier enable signal SAEN, and transfers the sensed data to first through fourth global lines GIO1-GIO4. The first through fourth align data ADIN<1:4> are aligned by synchronizing externally inputted data with a data strobe signal. Since the external data is inputted synchronously with a rising edge and a falling edge of the data strobe signal, when a burst length (BL) is four, four data are aligned in synchronization with a second falling edge of the data strobe signal. In other words, it takes 1.5 cycles of the clock signal CLK to align the data.

Meanwhile, the data strobe signal is toggled after an amount of time corresponding to the write latency and tDQSS. The tDQSS is a delay time from a rising edge of a clock signal at which the write command is inputted to a first rising edge of the data strobe signal. This is for compensating a difference in a delay time corresponding to a length of a line in a semiconductor memory device that transfers the clock signal CLK and a delay time corresponding to a line that transfers the data strobe signal when they do not exactly correspond to each other. In general, the tDQSS is defined as 0.75~1.25 cycles of the clock signal CLK.

If the WL is 1, the BL is 4 and the tDQSS is the maximum, i.e., 1.25 cycles of the clock signal CLK, it takes 3.75 cycles of the clock signal CLK until the external data is aligned synchronously with the data strobe signal. However, since the data sensing unit 600 can sense first through fourth align data ADIN<1:4> and transfer the sensed data to the first through fourth global lines GIO1-GIO4 after the external data is aligned synchronously with the data strobe signal, the sense amplifier enable signal SAEN should be enabled after the external data is aligned. In order to ensure such time margin, the sense amplifier enable signal SAEN is enabled after the write latency and 3 cycles of the clock signal CLK from the input of the write command.

Meanwhile, in order to increase the operation speed of a semiconductor memory device, the recent trend is to reduce a tWTR by advancing a time point at which a read command is inputted after a write operation. The tWTR is a delay period from a time just after the write operation to a time just before the read command is inputted, and is ensured so that a read operation can be started after data is sufficiently stored in a corresponding cell upon the write operation. In other words, the reduction of the tWTR by advancing the time point of the input of the read command can increase the operation speed of a semiconductor memory device, but may cause data loss since the read operation can be started in a state that a sufficient amount of charge is not stored in the cell.

BRIEF SUMMARY

In an aspect of this disclosure, there is provided an input circuit capable of shortening a write operation period and ensuring more tWTR by advancing a time point at which data inputted from the outside is sensed and transferred to a global line after input of a write command.

In an embodiment, a data input circuit includes a sensing control unit which delays an internal write command by a predetermined period and generates a sense amplifier enable signal in response to a first clock signal, and a data sensing unit which senses align data and transfers the sensed data to a global line in response to the sense amplifier enable signal, wherein the sense amplifier enable signal is enabled when the align data is inputted in the data sensing unit.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to the accompanying drawings.

However, the embodiments are for illustrative purposes only and are not intended to limit the scope of the invention.

Figure 1:
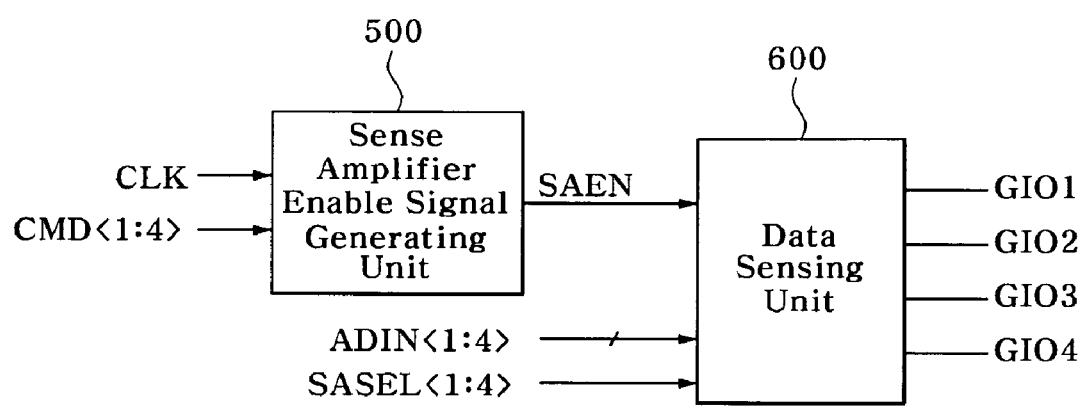
FIG. 1 is a block diagram illustrating a configuration of a data input circuit of a conventional semiconductor memory device.
Figure 2:
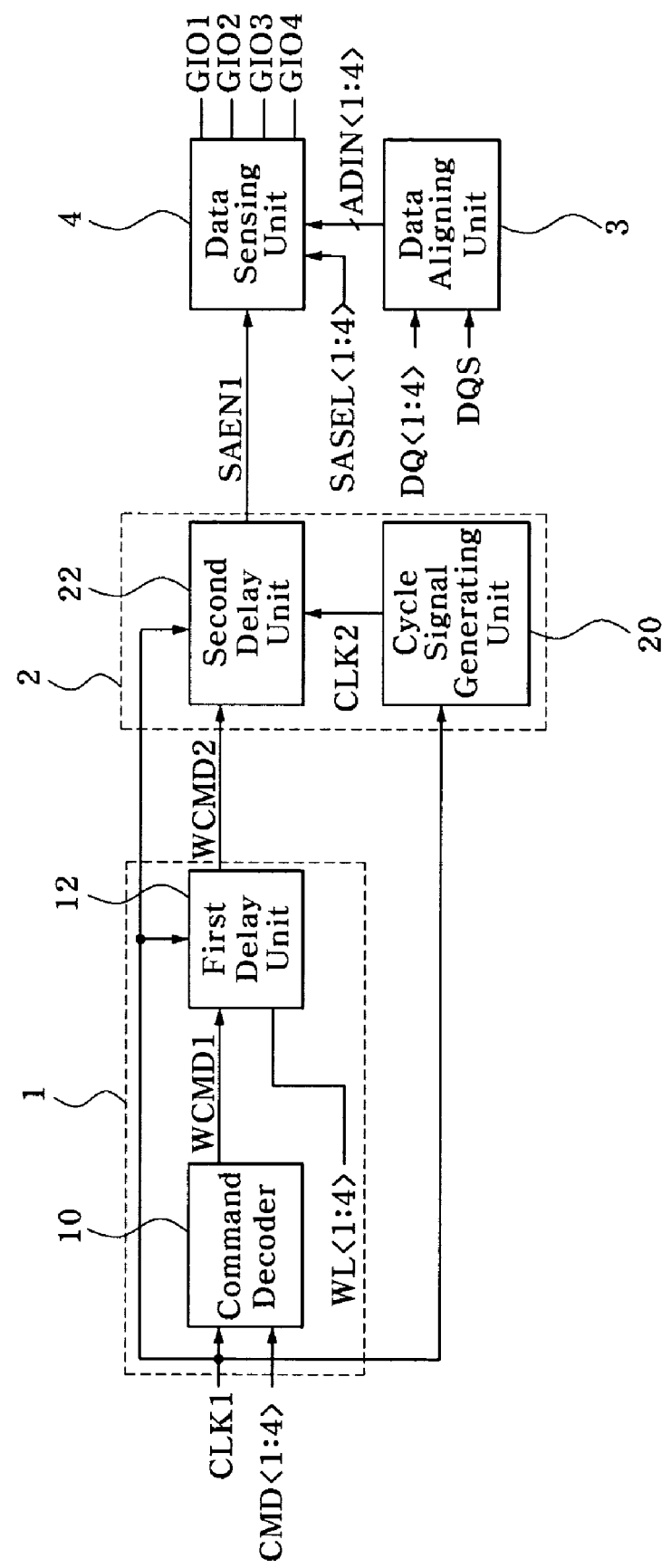
FIG. 2 is a block diagram illustrating a configuration of a data input circuit in accordance with an embodiment of the present invention.

FIG. 2 is a block diagram illustrating a configuration of a data input circuit in accordance with an embodiment of the present invention.

The data input circuit illustrated in FIG. 2 includes a write command generating unit 1, a sensing control unit 2, a data aligning unit 3 and a data sensing unit 4.

The write command generating unit 1 includes a command decoder 10 and a first delay unit 12.

The command decoder 10 receives a first clock signal CLK1 and first through fourth command signals CMD<1:4> and generates a first write command WCMD1. The first write command WCMD1 is enabled to a high level when the first through fourth command signals CMD<1:4> are in a preset combination.

Figure 3:
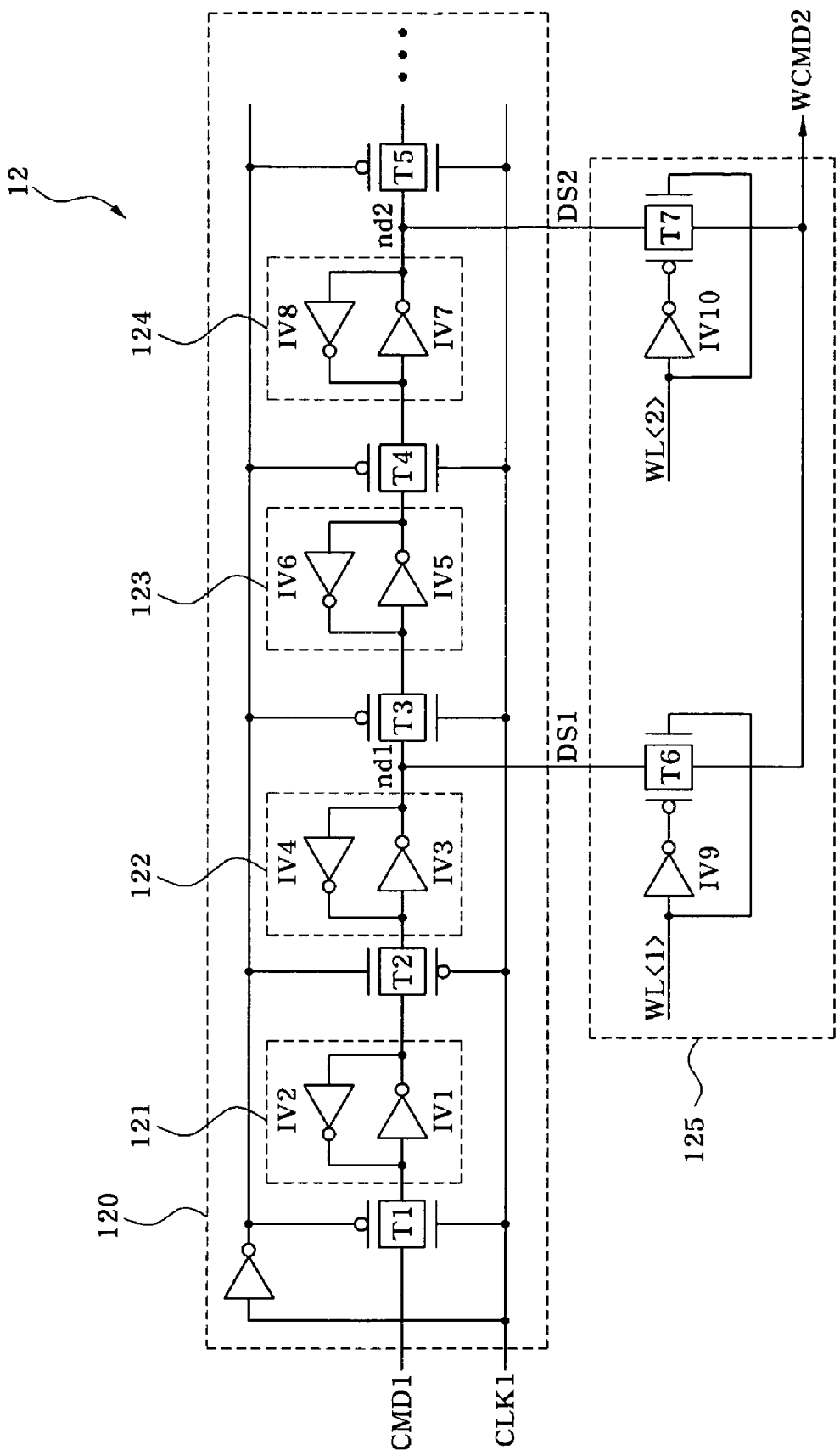
FIG. 3 is a circuit diagram illustrating a first delay unit in the data input circuit of FIG. 2.

The first delay unit 12 can include, as illustrated in FIG. 3, a first shift register 120 and a selection control unit 125.

The first shift register 120 shifts the first write command WCMD1 in response to the first clock signal CLK1 and generates a first delay signal DS1 and a second delay signal DS2, and includes a plurality of transfer gates T1-T5 selectively turned on in response to the first clock signal CLK1 and a plurality of latches 121-124 latching signals transferred through the transfer gates T1-T5.

The selection control unit 125 includes transfer gates T6 and T7, and selectively transfers one of the first delay signal DS1 and the second delay signal DS2 as a second write command WCMD2 according to a first write latency signal WL<1> or a second write latency signal WL<2>. The transfer gate T6 is turned on in response to the first write latency signal WL<1> and transfers the first delay signal DS1 as the second write command WCMD2. The transfer gate T7 is turned on in response to the second write latency signal WL<2> and transfers the second delay signal DS2 as the second write command WCMD2.

Here, the first delay signal DS1 is a signal generated by delaying the first write command WCMD1 by 0.5 cycle of the first clock signal CLK1 and having a high pulse width corresponding to the cycle of the first clock signal CLK1, and the second delay signal DS2 is a signal generated by delaying the first write command WCMD1 by 1.5 cycles of the first clock signal CLK1 and having a high pulse width corresponding to the cycle of the first clock signal CLK1.

As such, the first delay unit 12 selectively transfers one of the first delay signal DS1 generated by delaying the first write command WCMD1 by 0.5 cycle of the first clock signal CLK1 and the second delay signal DS2 generated by delaying the first write command WCMD1 by 1.5 cycles of the first clock signal CLK1 as the second write command WCMD2 based on the first and second write latency signals WL<1:2>, respectively. For example, when the write latency is set to 1, the first write latency signal WL<1> is enabled to a high level. Therefore, the first delay signal DS1 is transferred as the second write command WCMD2 through the transfer gate T6.

Next, the sensing control unit 2 includes, as illustrated in FIG. 2, a cycle signal generating unit 20 and a second delay unit 22.

Figure 4:
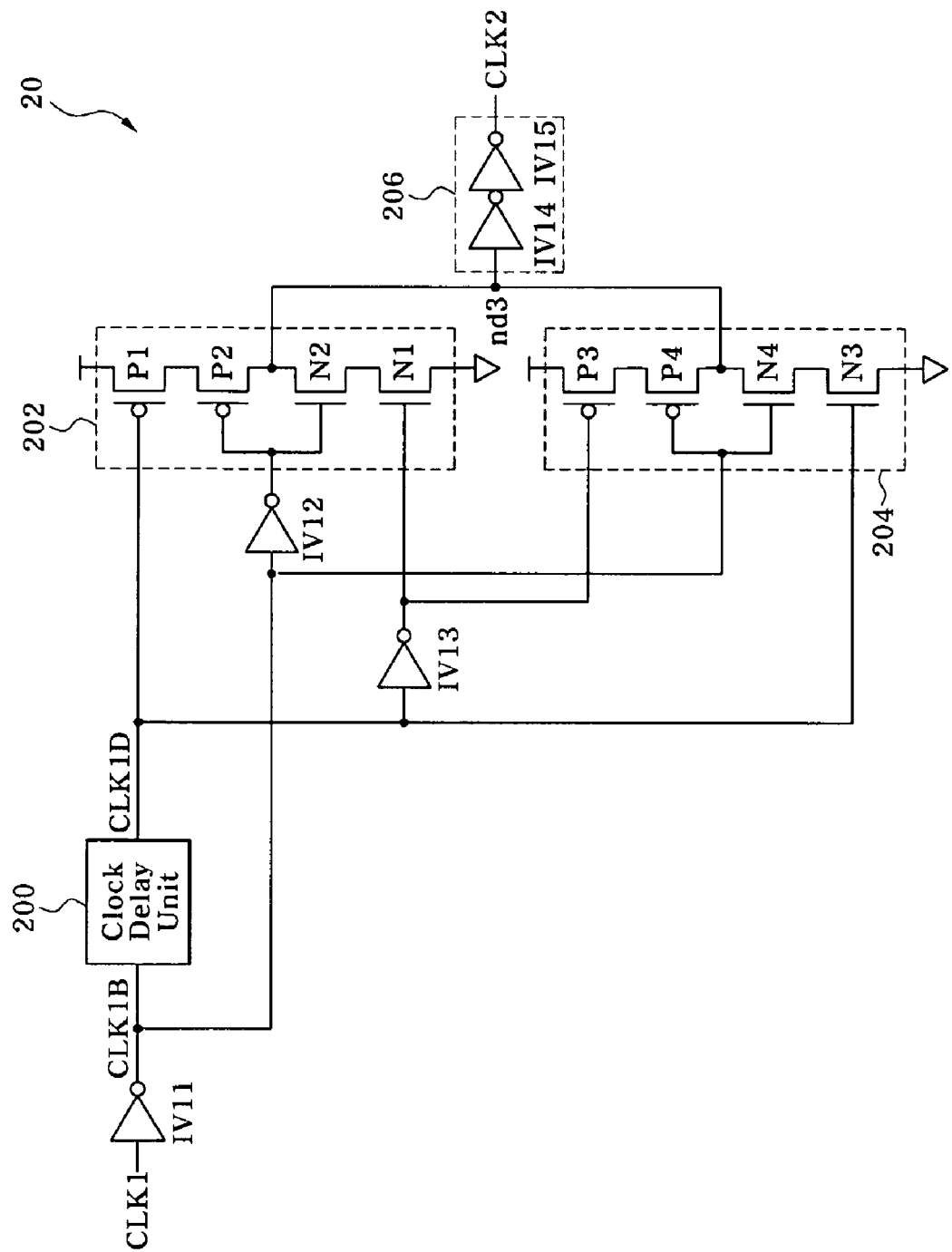
FIG. 4 is a circuit diagram illustrating a cycle signal generating unit in the data input circuit of FIG. 2.

The cycle signal generating unit 20 can include, as illustrated in FIG. 4, a clock delay unit 200, a first driving unit 202, a second driving unit 204 and a buffer unit 206.

The clock delay unit 200 delays an inverted first clock signal CLK1B by 0.25 cycle and generates a delayed first clock signal CLK1D The first driving unit 202 includes a PMOS transistor P1 turned on in response to the delayed first clock signal CLK1D, an NMOS transistor N1 turned on in response to an inverted signal of the delayed first clock signal CLK1D, and an NMOS transistor N2 and a PMOS transistor P2 selectively turned on in response to an inverted signal of the inverted first clock signal CLK1B.

The PMOS transistor P1 and the NMOS transistor N1 of the first driving unit 202 are turned on synchronously with a falling edge of the delayed first clock signal CLK1D. At this time, since the inverted first clock signal CLKLB is shifted to a low level before 0.25 cycle and the NMOS transistor N2 is turned on, a node nd3 is pulled down. However, when the inverted first clock signal CLK1B is shifted to a high level after 0.25 cycle, the PMOS transistor P2 is turned on and the node nd3 is pulled up. In other words, the first driving unit 202 is enabled every 0.5 cycle of the delayed first clock CLK1D, and pulls up or pulls down the node nd3 every 0.25 cycle in this enable period.

The second driving unit 204 includes an NMOS transistor N3 turned on in response to the delayed first clock signal CLK1D, a PMOS transistor P3 turned on in response to the inverted signal of the delayed first clock signal CLK1D, and a PMOS transistor P4 and an NMOS transistor N4 selectively turned on in response to the inverted first clock signal CLK1B.

The PMOS transistor P3 and the NMOS transistor N3 of the second driving unit 204 are turned on synchronously with a rising edge of the delayed first clock signal CLK1D. At this time, since the inverted first clock signal CLK1B is shifted to a high level before 0.25 cycle and the NMOS transistor N4 is turned on, the node nd3 is pulled down. However, when the inverted first clock signal CLK1B is shifted to a low level after 0.25 cycle, the PMOS transistor P4 is turned on and the node nd3 is pulled up. In other words, the second driving unit 204 is enabled every 0.5 cycle of the delayed first clock CLK1D, and pulls up or pulls down the node nd3 every 0.25 cycle in this enable period.

As such, the first driving unit 202 and the second driving unit 204 of the cycle signal generating unit 20 are alternately enabled every 0.5 cycle of the delayed first clock signal CLK1D, and pull up and pull down the node nd3 every 0.25 cycle of the delayed first clock signal CLK1D in each enable period. Therefore, a cycle of the second clock signal CLK2 generated by buffering the node nd3 becomes a half cycle of the first clock signal CLK1.

Figure 5:
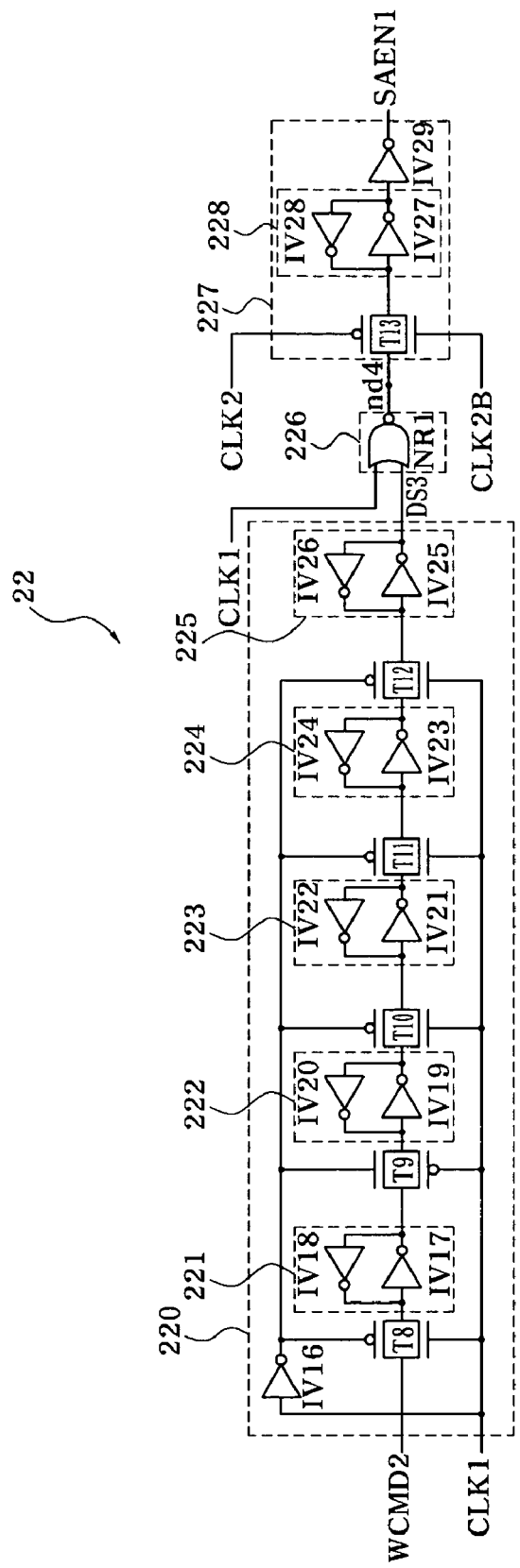
FIG. 5 is a circuit diagram illustrating a second delay unit in the data input circuit of FIG. 2.

Meanwhile, the second delay unit 22 can include, as illustrated in FIG. 5, a second shift register 220, a first transfer unit 226 and a second transfer unit 227.

The second shift register 220 shifts the second write command WCMD2 in response to the first clock signal CLK1 and generates a third delay signal DS3, and includes a plurality of transfer gates T8-T12 selectively turned on in response to the first clock signal CLK1 and a plurality of latches 221-225 latching signals transferred through the transfer gates T8-T12. Here, the third delayed signal DS3 is a signal generated by delaying the second write command WCMD2 by 2 cycles of the first clock signal CLK1.

The first transfer unit 226 includes a NOR gate NR1 which performs a NOR operation on the third delay signal DS3 and the first clock signal CLK1.

The third delay signal DS3 is shifted to a low level when the transfer gate T12 is turned on synchronously with the rising edge of the first clock signal CLK1. At this time, the first transfer unit 226 interrupts the transfer of the third delay signal DS3 in response to the first clock signal CLK1 and set the node nd4 to a low level. After that, the third delay signal DS3 is transferred to the node nd4 synchronously with the falling edge of the first clock signal CLK1 and an output signal of the first transfer unit 226 becomes a high level. In other words, the output signal of the first transfer unit 226 is a signal generated by delaying the second write command WCMD2 by 2.5 cycles of the first clock signal CLK1.

The second transfer unit 227 includes a transfer gate T13 turned on in response to the second clock signal CLK2, a latch 228 latching the output signal of the first transfer unit 226 transferred through the transfer gate T13, and an inverter IV29 inverting and buffering an output signal of the latch 228 and generating a sense amplifier enable signal SAEN1.

When the first clock signal CLK1 is shifted to a low level, since the output signal of the first transfer unit 226 becomes a high level but the second clock signal CLK2 is shifted to a high level, the transfer gate T13 of the second transfer unit 227 is turned off. However, since the second clock signal CLK2 is shifted to a low level after the first clock signal CLK1 is shifted to a low level and then 0.25 cycle is elapsed, the transfer gate T13 is turned on and the output signal of the first transfer gate 226 is transferred as the sense amplifier enable signal SAEN1. In other words, the sense amplifier enable signal SAEN1 is enabled to a high level after delay of 2.75 cycles of the first clock signal CLK1 from the input of the second write command WCMD2.

As such, the second delay unit 22 generates the sense amplifier enable signal SAEN1 enabled after the delay of 2.75 cycles of the first clock signal CLK1 using the first clock signal CLK1 and the second clock signal CLK2 having different cycles from each other.

The data aligning unit 3 receives first through fourth data DQ<1:4> inputted from the outside and aligns them synchronously with the data strobe signal DQS. When the burst length is 4, the first through fourth data DQ<1:4> are sequentially inputted synchronously with a rising edge and a falling edge of the data strobe signal DQS, and aligned synchronously with a second falling edge of the data strobe signal DQS.

Figure 6:
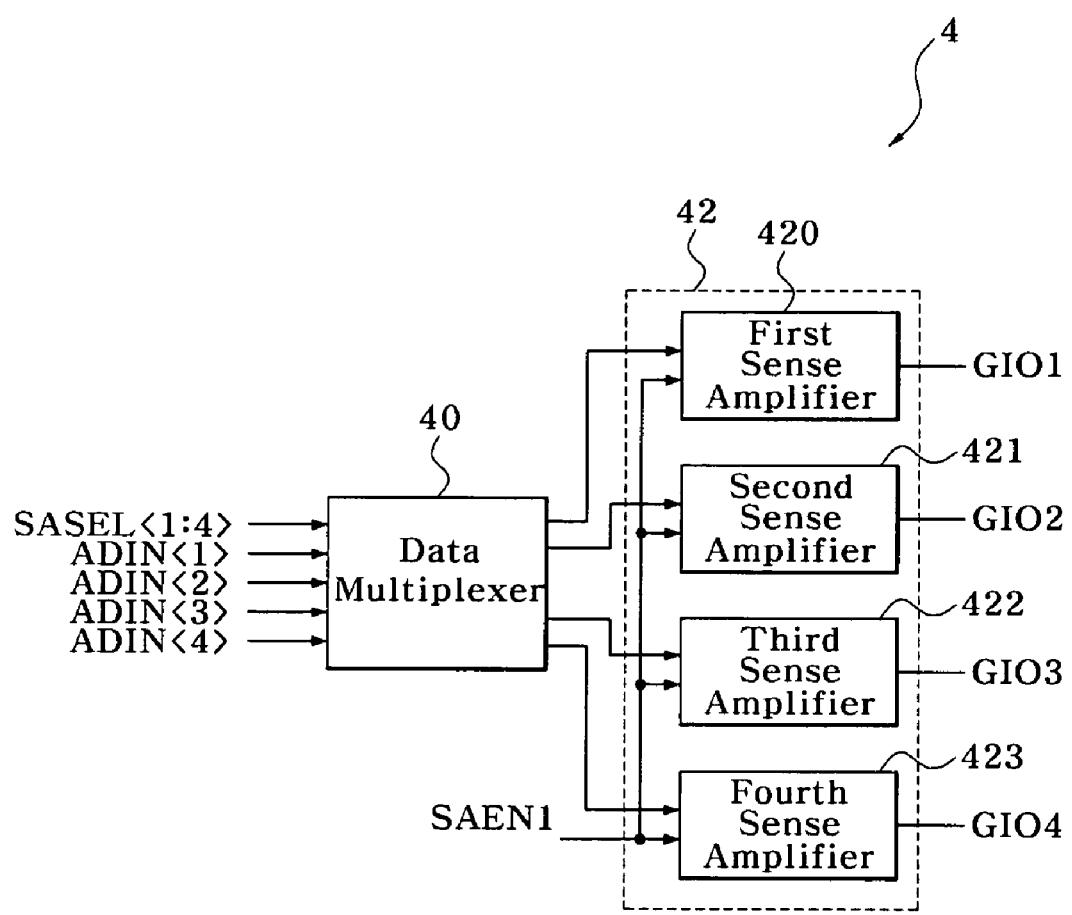
FIG. 6 is a block diagram illustrating a configuration of a data sensing unit in the data input circuit of FIG. 2.

The data sensing unit 4 can include, as illustrated in FIG. 6, a data multiplexer 40 and a sense amplifier unit 42.

The data multiplexer 40 receives the first through fourth align data ADIN<1:4> and multiplexes them based on the first through fourth sense amplifier selection signals SASEL<1:4>.

The sense amplifier unit 42 includes first through fourth sense amplifiers 420-423, and senses the first through fourth align data ADIN<1:4> assigned by the multiplexing of the data multiplexer 40 and transfers the sensed data to the first through fourth global lines GIO1-GIO4 in response to the sense amplifier enable signal SAEN1.

For example, when the third sense amplifier selection signal SASEL<3> of the first through fourth sense amplifier selection signals SASEL<1:4> is enabled, the data multiplexer 40 outputs the first align data ADIN<1> to the third sense amplifier 422, the second align data ADIN<2> to the fourth sense amplifier 423, the third align data ADIN<3> to the first sense amplifier 420, and the fourth align data ADIN<4> to the second sense amplifier 421. Here, the first through fourth sense amplifier selection signals SASEL<1:4> are generated from some bits of a column address and are for setting a sequence of the data.

Operation of the data input circuit configured as described above will be described in detail with reference to FIGS. 2 through 7.

First, it is assumed that the write latency is set to 1 and the burst length is set to 4.

Referring to FIG. 2, the command decoder 10 generates the first write command WCMD1 for the write operation synchronously with the first clock signal CLK1 when the first through fourth command signals CMD<1:4> are in a combination indicating the write command.

Figure 7:
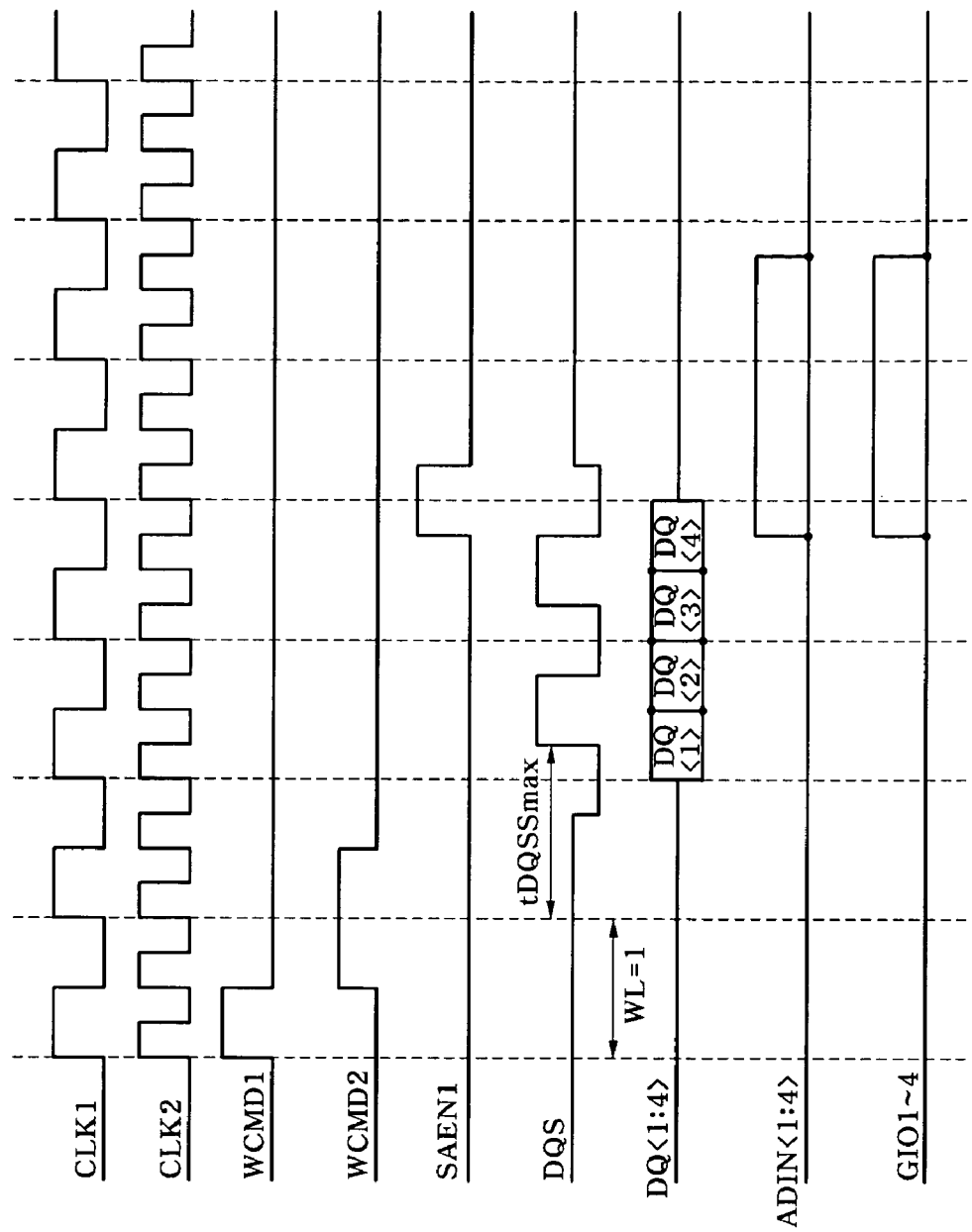
FIG. 7 is a timing diagram illustrating timing in operation of the data input circuit of FIG. 2.

Referring to FIG. 3, the first shift register 120 of the first delay unit 12 shifts the first write command WCMD1 in response to the first clock signal CLK1, and generates the first delay signal DS1 delayed by 0.5 cycle of the first clock signal CLK1 and the second delay signal DS2 delayed by 1.5 cycle of the first clock signal CLK1. Further, the selection control unit 125 selectively transfers the first delay signal DS1 or the second delay signal DS2 as the second write command WCMD2 based on the first and second write latency signals WL<1:2>. Since the write latency is previously set to 1, the first delay unit 12 outputs the first delay signal DS1 generated by delaying the first write command WCMD1 by 0.5 cycle of the first clock signal CLK1 to the second write command WCMD2, as illustrated in FIG. 7.

Referring to FIG. 4, the clock delay unit 200 of the cycle signal generating unit 20 generates the delayed first clock signal CLK1D generated by delaying the inverted first clock signal CLK1B by 0.25 cycle.

The first driving unit 202 is enabled in a low level period of the delayed first clock signal CLK1D, and the second driving unit 204 is enabled in a high level period of the delayed first clock signal CLK1D. In other words, the first driving unit 202 and the second driving unit 204 are alternately enabled every 0.5 cycle of the delayed first clock signal CLK1D.

More specifically, when the PMOS transistor P1 and the NMOS transistor N1 of the first driving unit 202 are turned on synchronously with the falling edge of the delayed first clock signal CLK1D, the node nd3 is pulled down through the NMOS transistor N1 and the NMOS transistor N2 since the NMOS transistor N2 has been already turned on in response to the inverted first clock signal CLK1B shifted to a low level before 0.25 cycle. When the inverted first clock signal CLK1B is shifted to a high level after lapse of 0.25 cycle, the PMOS transistor P2 is turned on and the node is thus pulled up.

Further, when another 0.25 cycle is elapsed and the delayed first clock signal CLK1D is shifted to a high level, the PMOS transistor P1 and the NMOS transistor N1 of the first driving unit 202 is turned off synchronously with the rising edge of the delayed first clock signal CLK1D.

Meanwhile, the PMOS transistor P3 and the NMOS transistor N3 of the second driving unit 204 are turned on synchronously with the rising edge of the delayed first clock signal CLK1D. At this time, since the NMOS transistor N4 has been turned on in response to the inverted first clock signal CLK1B of a high level, the node nd3 is pulled down. When the inverted first clock signal CLK1B is shifted to a low level after lapse of 0.25 cycle.

As such, the first driving unit 202 pulls down and pulls up based on a level of the inverted first clock signal CLK1B in a low level period of the delayed first clock signal CLK1D. Further, the second driving unit 204 pulls down and pulls up based on a level of the inverted first clock signal CLK1B in a high level period of the delayed first clock signal CLK1D. Therefore, the cycle of the second clock signal CLK2 generated by buffering the signal of the node nd3 becomes, as illustrated in FIG. 7, half of the cycle of the first clock signal CLK1.

Referring to FIG. 5, the second shift register 220 of the second delay unit 22 receives the second write command WCMD2, shifts it in response to the first clock signal CLK1 and generates the third delay signal DS3. Here, the third delay signal DS3 is shifted to a low level when the transfer gate T12 is turned on synchronously with the rising edge after 2 cycles of the first clock signal CLK1. In other words, the third delay signal DS3 is a signal delayed by 2 cycle of the first clock signal CLK1 as compared to the second write command WCMD2.

When the third delay signal DS3 is shifted to a low level, the first transfer unit 226 interrupts the transfer of the third delay signal DS3 since the first clock signal CLK1 is in a high level, and the first transfer unit 226 transfers the third delay signal DS3 when the first clock signal CLK1 is shifted to a low level. In other words, the first transfer unit 226 receives the third delay signal DS3 and transfers it after 0.5 cycle of the first clock signal CLK1.

The second transfer unit 227 buffers the output signal of the first transfer unit 226 in response to the second clock signal CLK2 and transfers the buffered signal to the sense amplifier enable signal SAEN1. As illustrated in FIG. 7, since the cycle of the second clock signal CLK2 is half of the first clock signal CLK1, the second clock signal CLK2 is shifted to a low level after the first transfer unit 226 transfers the third delay signal DS3 and 0.25 cycle of the first clock signal CLK1 is elapsed. At this time, the transfer gate T13 of the second transfer unit 227 is turned on and the sense amplifier enable signal SAEN1 is enabled to a high level. In other words, the sense amplifier enable signal SAEN1 is a signal delayed by 2.75 cycle of the first clock signal CLK1 as compared to the second write command WCMD1.

Meanwhile, the data aligning unit 3 receives and aligns the first through fourth data DQ<1:4> in response to the data strobe signal DQS. At this time, the data strobe signal DQS is toggled after delay of the write latency (that is, 1) and tDQSSmax from the input of the first write command WCMD1. The tDQSSmax is 1.25 cycles of the first clock signal CLK1. The alignment of the first through fourth data DQ<1:4> is completed in synchronization with the second falling edge of the data strobe signal DQS. Therefore, the first through fourth align data ADIN<1:4> generated by aligning the first through fourth data DQ<1:4> is inputted to the data sensing unit 4.

Referring to FIG. 6, the data multiplexer 40 of the data sensing unit 4 receives the first through fourth align data ADIN<1:4>, multiplexes them based on the first through fourth sense amplifier selection signals SASEL<1:4> and transfers the multiplexed data to the sense amplifier unit 42. The first through fourth sense amplifiers 420-423 sense the first through fourth align data ADIN<1:4> assigned by the data multiplexer 40 and transfers the sensed data to the first through fourth global lines GIO1-GIO4, respectively, in response to the sense amplifier enable signal SAEN1. As illustrated in FIG. 7, the sense amplifier enable signal SAEN1 is enabled to a high level in a period in which the first through fourth align data ADIN<1:4> are inputted to the data sensing unit 4. Therefore, the data sensing unit 4 senses the first through fourth align data ADIN<1:4> at the same time with the input of them after the alignment of the first through fourth data DQ<1:4>, and transfers the sensed data to the first through fourth global lines GIO1-GIO4.

In the embodiment described above, the sense amplifier enable signal SAEN1 is delayed by 2.75 cycles of the first clock signal CLK1 as compared to the second write command WCMD2 based on the tDQSSmax. However, it is possible to control the delay period of the sense amplifier enable signal SAEN1 by adjusting a number of the transfer gate T8-T12 of the second delay unit 16 based on a predetermined value of the tDQSS.

Briefly describing, the conventional art has a problem that a predetermined time margin is present from input of the first through fourth align data ADIN<1:4> to the transfer of them to the first through fourth global lines GIO1-GIO4 and thus the write operation period is unnecessarily lengthened.

On the other hand, in the present invention, the data sensing unit 4 senses the first through fourth align data ADIN<1:4> at the same time with the input of them after the alignment of the first through fourth data DQ<1:4>, and transfers the sensed data to the first through fourth global lines GIO1-GIO4 by controlling the enable time point of the sense amplifier enable signal SAEN1 by a shorter time unit using the first clock signal CLK1 and the second clock signal CLK2 having a half cycle of the first clock signal CLK1. Therefore, it is possible to ensure more tWTR before the input of the read command by reducing the unnecessary time margin during the write operation period and advancing the time point of completion of the write operation as compared to the conventional art.

While the present invention has been described with respect to the specific embodiments, it will be apparent to those skilled in the art that various changes and modifications may be made without departing from the spirit and scope of the invention as defined in the following claims.

The present disclosure claims priority to Korean application number 10-2009-0011597, filed on Feb. 12, 2009, which is incorporated herein by reference.

What is claimed is:

1. A data input circuit, comprising:
 a sensing control unit which delays an internal write command by a predetermined period and generates a sense amplifier enable signal in response to a first clock signal;
 a data multiplexer which receives a plurality of align data and multiplexes the align data based on a sense amplifier selection signal; and
 a sense amplifier unit which sense the multiplexed align data output from the data multiplexer and transfers the sensed data to a global line in response to the sense amplifier enable signal.

2. The data input circuit of claim 1, further comprising: a write command generating unit which generates a write command, delays the write command by a write latency and outputs the delayed write command as the internal write command.

3. The data input circuit of claim 2, wherein the write command generating unit comprises:
 a command decoder which receives a command signal and generates the write command; and
 a first delay unit which delays the write command based on the write latency and outputs the delayed command as the internal write command.

4. The data input circuit of claim 3, wherein the first delay unit comprises:
 a first shift register which shifts the write command in response to the first clock signal and generates sequentially a first delay signal and a second delay signal; and
 a selection control unit which selectively transfers one of the first delay signal and the second delay signal as the internal write command based on the write latency.

5. The data input circuit of claim 4, wherein the selection control unit comprises:
 a first transfer gate which is turned on at a timing in accordance with the write latency and transfers the first delay signal as the internal write command; and
 a second transfer gate which is turned on at a timing in accordance with the write latency and transfers the second delay signal as the internal write command.

6. The data input circuit of claim 5, wherein the first transfer gate and the second transfer gate are selectively turned on based on the write latency.

7. The data input circuit of claim 1, wherein the sensing control unit comprises:

a cycle signal generating unit which receives the first clock signal and generates a second clock signal having a different cycle than the first clock signal; and a second delay unit which delays the write command by a predetermined delay period in response to the first clock signal and the second clock signal and transfers the delayed command as the sense amplifier enable signal.

8. The data input circuit of claim 7, wherein a cycle of the second clock signal is a half cycle of the first clock signal.

9. The data input circuit of claim 7, wherein the delay period is set by combination of the cycles of the first clock signal and the second clock signal.

10. The data input circuit of claim 7, wherein the cycle signal generating unit comprises:

a clock delay unit which delays an inverted first clock signal by a predetermined period and generates a delayed first clock signal;

a first driving unit which is enabled according to a level of the delayed first clock signal and pulls up or pulls down a node in accordance with a level of the inverted first clock signal;

a second driving unit which is enabled according to the level of the delayed first clock signal and pulls up or pulls down the node in accordance with the level of the inverted first clock signal; and a buffer unit which buffers a signal of the node and generates the second clock signal.

11. The data input circuit of claim 10, wherein the first driving unit and the second driving unit are selectively enabled according to the level of the delayed first clock signal.

12. The data input circuit of claim 7, wherein the second delay unit comprises:

a second shift register which shifts the internal write command in response to the first clock signal and generates a third delay signal;

a first transfer unit which receives the third delay signal and transfers the third delay signal in response to the first clock signal; and a second transfer unit which buffers an output signal of the first transfer unit to obtain a buffered signal and transfers the buffered signal as the sense amplifier enable signal in response to the second clock signal.

13. The data input circuit of claim 1, further comprising: a data aligning unit which aligns external data synchronously with a data strobe signal and outputs the aligned data.

14. The data input circuit of claim 1, wherein the align data are respectively assigned to first through fourth sense amplifiers included in the sense amplifier unit according to the sense amplifier selection signal.

15. A data input circuit, comprising:

a cycle signal generating unit which receives a first clock signal and generates a second clock signal having a different cycle from the first clock signal;

a first delay unit which delays an internal write command by a predetermined delay period in response to the first clock signal and the second clock signal and transfers the delayed command as a sense amplifier enable signal; and a data multiplexer configured to receive a plurality of align data and multiplexes the align data based on a sense amplifier selection signal; and a sense amplifier unit which senses the multiplexed align data output from the data multiplexer and transfers the sensed data in response to the sense amplifier enable signal.

16. The data input circuit of claim 15, wherein a cycle of the second clock signal is a half cycle of the first clock signal.

17. The data input circuit of claim 15, wherein the cycle signal generating unit comprises:

a clock delay unit which delays an inverted first clock signal by a predetermined period and generates a delayed first clock signal;

a first driving unit which is enabled in accordance with a level of the delayed first clock signal and pulls up or pulls down a node according to a level of the inverted first clock signal;

a second driving unit which is enabled in accordance with the level of the delayed first clock signal and pulls up or pulls down the node according to the level of the inverted first clock signal; and a buffer unit which buffers a signal of the node and generates the second clock signal.

18. The data input circuit of claim 17, wherein the first driving unit and the second driving unit are selectively enabled based on the level of the delayed first clock signal.

19. The data input circuit of claim 15, wherein the delay period is set by combination of the cycles of the first clock signal and the second clock signal.

20. The data input circuit of claim 15, wherein the first delay unit comprises:

a first shift register which shifts the internal write command in response to the first clock signal and generates a third delay signal;

a first transfer unit which receives the third delay signal and transfers the third delay signal in response to the first clock signal; and a second transfer unit which buffers an output signal of the first transfer unit to obtain a buffered signal and transfers the buffered signal as the sense amplifier enable signal in response to the second clock signal.

21. The data input circuit of claim 15, wherein the align data are respectively assigned to first through fourth sense amplifiers included in the sense amplifier unit according to the sense amplifier selection signal.

22. The data input circuit of claim 15, further comprising: a write command generating unit which generates a write command, delay the write command by a write latency and outputs the delayed write command as the internal write command.

23. The data input circuit of claim 15, further comprising: a data aligning unit which aligns external data synchronously with a data strobe signal and outputs the aligned data.

* * * * *